(12) United States Patent
Barber et al.

(10) Patent No.: US 10,015,878 B2
(45) Date of Patent: *Jul. 3, 2018

(54) DECOUPLING ARRANGEMENT

(71) Applicant: Intel Corporation, Santa Clara, CA (US)

(72) Inventors: William L. Barber, Bampton (GB); Keith Pinson, Swindon (GB); Andrew P. Collins, Hillsboro, OR (US); Boping Wu, Folsom, CA (US); Isaac Ali, Bristol (GB); Colin L. Perry, Swindon (GB)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/945,762

(22) Filed: Nov. 19, 2015

(65) Prior Publication Data

US 2016/0309580 A1 Oct. 20, 2016

Related U.S. Application Data

(63) Continuation of application No. 14/534,979, filed on Nov. 6, 2014, now Pat. No. 9,225,164, which is a continuation of application No. 13/331,500, filed on Dec. 20, 2011, now Pat. No. 8,913,364.

(51) Int. Cl.
*H02H 9/04* (2006.01)
*H05K 1/02* (2006.01)
*H01L 23/50* (2006.01)

(52) U.S. Cl.
CPC .......... *H05K 1/0231* (2013.01); *H01L 23/50* (2013.01); *H02H 9/04* (2013.01); *H05K 1/025* (2013.01); *H01L 2924/0002* (2013.01); *H05K 2201/09672* (2013.01)

(58) Field of Classification Search
CPC ........ H02H 9/04; H05K 1/0231; H05K 1/025; H01L 23/50
USPC ...................................................... 361/111
See application file for complete search history.

(56) References Cited

U.S. PATENT DOCUMENTS

| 6,657,291 | B1 * | 12/2003 | Magerlein | ............... | H01L 23/50 257/691 |
| 7,262,951 | B2 * | 8/2007 | Hou | ..................... | H01L 23/5223 257/700 |
| 7,843,979 | B2 * | 11/2010 | Rees | ....................... | H01S 5/042 372/38.02 |
| 7,994,606 | B2 * | 8/2011 | Hou | ..................... | H01L 23/5223 257/508 |
| 8,913,364 | B2 * | 12/2014 | Barber | ................. | H05K 1/0231 361/111 |
| 2007/0108554 | A1 * | 5/2007 | Hou | ..................... | H01L 23/5223 257/532 |

(Continued)

*Primary Examiner* — Dharti Patel

(57) ABSTRACT

In various embodiments, apparatuses and methods are disclosed that may be able to implement a multi-layer, three dimensional routing between a decoupling component and an input port for a SoC or MCM. A three dimensional (3D) structure may provide a defined current return path from the decoupling component to the input port. The current return path may be constrained by design to provide an equal and opposite electromagnetic flux to the input port thereby reducing series inductance between the input port and the decoupling component.

9 Claims, 5 Drawing Sheets

(56) References Cited

U.S. PATENT DOCUMENTS

2010/0117192 A1\* 5/2010 Lee .................... H01G 2/06
257/532

\* cited by examiner

100

200

300

400

500

600

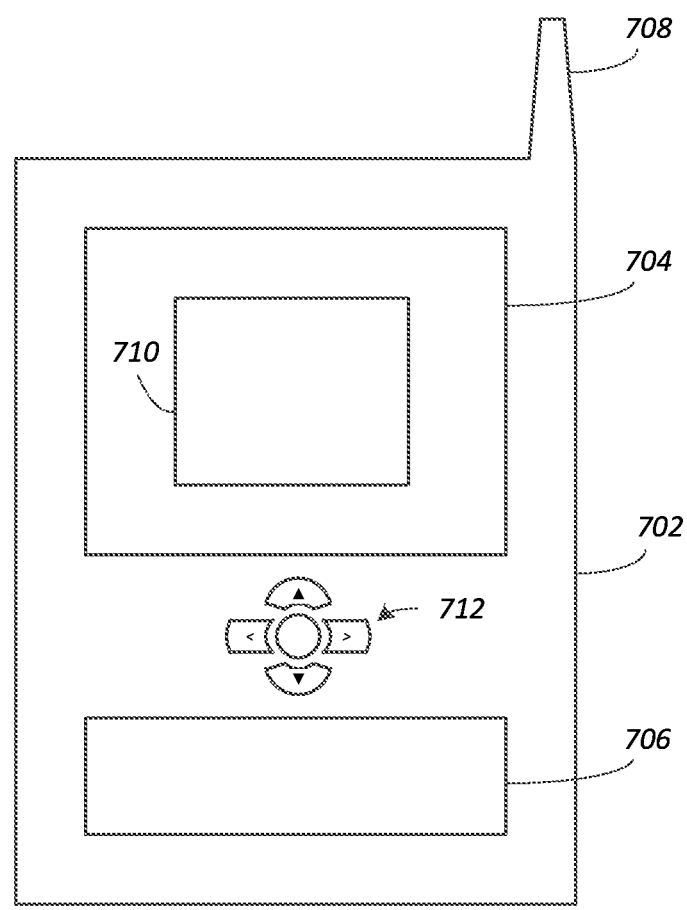

DECOUPLING ARRANGEMENT

CROSS-REFERENCE TO RELATED APPLICATIONS

This application is a continuation of, claims the benefit of and priority to previously filed U.S. patent application Ser. No. 14/534,979 entitled "Decoupling Arrangement" filed Nov. 6, 2014, which is a continuation of U.S. patent application Ser. No. 13/331,500, entitled "Decoupling Arrangement" filed Dec. 20, 2011 and subsequently issued as U.S. Pat. No. 8,913,364 on Dec. 16, 2014; both of the above are hereby incorporated by reference in their entirety.

BACKGROUND

Decoupling of device ports such as, for instance, supply ports, reference ports, and decoupling ports may be an important consideration when designing decoupling arrangements for a system on a chip (SoC) or a multi-chip module (MCM). Ports such as these may be used in differential input arrangements. Poorly designed decoupling solutions may lead to system performance issues on the SoC or MCM. A poorly designed decoupling arrangement may be one that introduces an undesirable series inductance between the decoupling point and the port. Accordingly, there may be a need for improved techniques to solve these and other problems.

BRIEF DESCRIPTION OF THE DRAWINGS

FIG. 7 illustrates embodiments of a small form factor device in which the system of FIG. 7 may be embodied.

DETAILED DESCRIPTION

Figure 1:
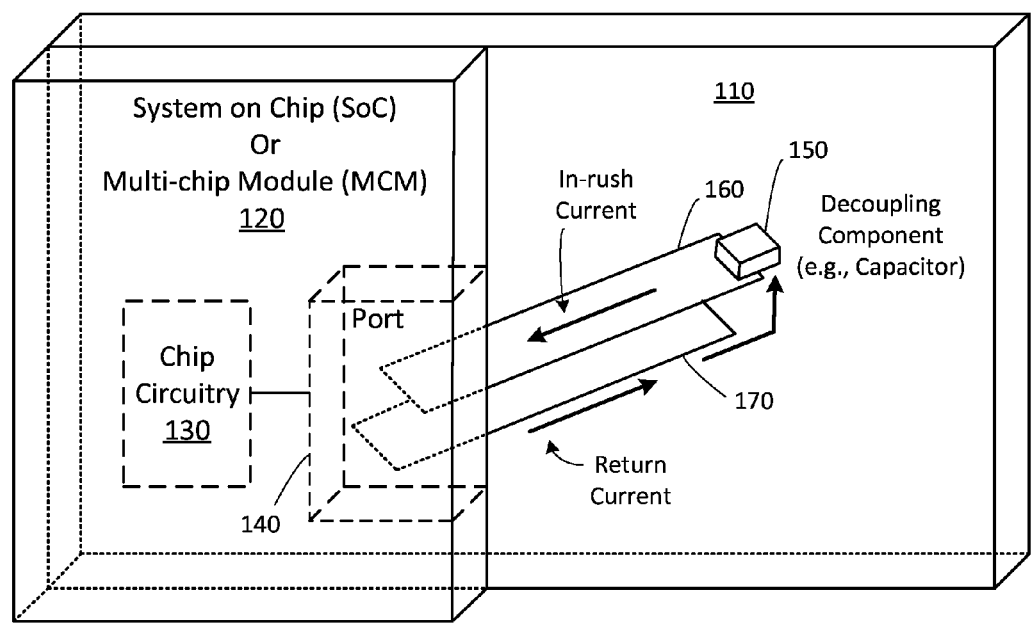
FIG. 1 illustrates a block diagram of a system according to an embodiment.

Decoupling of device ports such as, for instance, supply ports, reference ports, and decoupling ports may be an important consideration when designing decoupling arrangements for a system on a chip (SoC) or a multi-chip module (MCM). Ports such as these may be used in differential input arrangements. Poorly designed decoupling solutions may lead to system performance issues on the SoC or MCM. A poorly designed decoupling arrangement may be one that introduces an undesirable series inductance between the decoupling point and the port.

For example, some supply ports may exhibit an in-rush current associated with, for example, global power on reset or enable. If the supply port is not adequately decoupled, the in rush current may result in port voltage bounce due to a parasitic inductance between the decoupling point and supply port. This may, in turn, lead to a spurious reset being generated leading to a potential start up lock out, e.g., the act of enabling the circuit leads to a spurious reset back into a standby state.

Another example may be any circuit that includes a high speed switching port. This may be a switched mode voltage regulator circuit in which the in rush current associated with switching may lead to line voltage ringing.

In a reference port, decoupling arrangements exhibiting an undesirable series inductance may lead to a loss in high frequency gain and degradation in noise figure (NF).

With printed circuit board (PCB) platform components, these issues can be overcome by simple techniques such as placing decoupling arrangements in immediate proximity to the port thereby reducing inductance. In the above spurious reset examples, this was corrected by simply moving the supply decoupling component closer to the port. In the case of switched mode regulators recommended layouts always place the line decoupling close to the port, and since the decoupling capacitors are mounted on a PCB with the switched mode regulator a physically and electrically large component can be used which will enable wide track routing and hence low parasitic inductance.

However, for an SoC, an MCM or other hybrid module solutions where the port may be embedded in an integrated circuited mounted on a substrate, traditional PCB techniques may no longer be applicable. For example, routing widths may be greatly restricted, the value of decoupling components may be significantly smaller, and there may be component placement restrictions that restrict placing decoupling components in a desirable location.

A further complication is that within an SoC process the gate sustain voltage may typically be significantly lower than with a platform mounted component, hence any port voltage ringing associated with current in rush can, in addition to the aforementioned problems, lead to port junction electrical overstress and degrade long term reliability.

The embodiments described herein present a solution to facilitate improved decoupling arrangements in such solutions. In should be noted that this technique may also be deployed on PCB implementations, however it may provide the greatest benefit in SoC or MCM implementations.

The traditional routing approach for decoupling a port has been to mount the decoupling component close to the port then route a metal track from the decoupling component to the port in which the metal track routing would be made as wide as physically possible.

Within an SoC or MCM routing is generally highly congested making it unfeasible to route a wide track from a decoupling component to a port. In addition, component mounting constraints dictate that the decoupling component be placed further from the port on an SoC or MCM than on a PCB. For example, assembly rules require that such components must be placed at least 2 mm from the die to allow for die encapsulation.

Therefore, there may be (at least) two undesirable effects with traditional approaches. One is that the decoupling component may be further than desirable from the port and the other is that the routing to the port may be narrower than desirable. Both of these effects may contribute to a lower level of decoupling than desirable. This may lead to port voltage ringing in the case of current in rush. This may also result in an ineffective reference port as a result of parasitic inductance in the case of differential input stages.

In various embodiments, apparatuses and methods are disclosed that may be able to implement a multi-layer, three dimensional routing between a decoupling component and a port for a SoC or MCM. A three dimensional (3D) structure may provide a defined current return path from the decoupling component to the port. The current return path may be constrained by design to provide an equal and opposite electromagnetic flux to the port track. The electromagnetic flux to the port track may result in a high mutual inductance that may lead to a reduction in undesirable parasitic inductance between decoupling component and port. The embodiments described herein have been developed to mitigate against port voltage ringing, electrical overstress, and 'reset' on supply ports with switched mode voltage regulators as a result of current in rush.

Electrical overstress (EOS) is a term/acronym used to describe the thermal damage that may occur when an electronic device is subjected to a current or voltage that is beyond the specification limits of the device. The thermal damage is the result of the excessive heat generated during the EOS event. The heat is a result of resistive heating in the connections within the device. The high currents experienced during the EOS event can generate very localized high temperatures even in the normally low resistance paths. The high temperature causes destructive damage to the materials used in the device's construction. An EOS event can be a momentary event lasting only milliseconds or can last as long as the conditions persist. EOS can be the result of a single non-recurring event or the result of ongoing periodic or non-periodic events.

A system on a chip or system on chip (SoC or SOC) is an integrated circuit (IC) that integrates all components of a computer or other electronic system into a single chip. It may contain digital, analog, mixed-signal, and often radio-frequency functions—all on a single chip substrate. A typical application is in the area of embedded systems.

A typical SoC may be comprised of a microcontroller, microprocessor or digital signal processor (DSP) core(s). Some SoCs may include more than one processor core. A SoC may also include memory blocks such as read-only memory (ROM), random access memory (RAM), electrically erasable programmable read-only memory (EEPROM), and flash memory. A SoC may also include timing sources including oscillators and phase-locked loops, peripherals including counter-timers, real-time timers and power-on reset generators, and voltage regulators and power management circuits. These components may be very densely packed and connected by either a proprietary or industry-standard bus.

A multi-chip module (MCM) may be a specialized electronic package where multiple integrated circuits (ICs), semiconductor dies or other discrete components are packaged onto a unifying substrate, facilitating their use as a single component. The MCM, like a SoC, may be very densely packed.

Decoupling refers to shielding one part of an electrical network (circuit) from another. A decoupling capacitor is used to shunt noise caused by other circuit elements through the capacitor, reducing the effect they have on the rest of the circuit. For example, changing power demands may be due to a changing current demand when the voltage level for a device is fixed. The power supply must accommodate these variations in current draw with as little change as possible in the power supply voltage. When the current draw in a device changes, the power supply cannot respond to that change instantaneously. As a consequence, the voltage at the device changes for a brief period before the power supply responds. The voltage regulator adjusts the amount of current it is supplying to keep the output voltage constant but can only effectively maintain the output voltage for events at frequencies from DC to a few hundred kHz, depending on the voltage regulator. For transient events that occur at frequencies above this range, there may be a time lag before the voltage regulator responds to the new current demand level.

The decoupling capacitor may function as a local energy storage for the device. The capacitor cannot provide DC power because it stores only a small amount of energy but this energy can respond very quickly to changing current demands. The decoupling capacitor may effectively maintain power-supply voltage at frequencies from hundreds of kHz to hundreds of MHz.

One type of decoupling is that of a powered circuit from signals in a power supply. Sometimes a power supply supplies an AC signal superimposed on the DC power line. Such a signal is often undesirable in the powered circuit. A decoupling capacitor can prevent the powered circuit from seeing that signal, thus decoupling it from the power supply circuit.

Another type of decoupling involves preventing a portion of a circuit from being affected by switching that happens in another portion. Switching in a sub-circuit A may cause fluctuations in the power supply or other electrical lines that may be undesirable to a sub-circuit B. A decoupling capacitor may decouple sub-circuits A and B so that B may not be affected by the switching.

To decouple a sub-circuit from AC signals or voltage spikes on a power supply or other line, a bypass capacitor is often used. A bypass capacitor may be used to shunt energy from those signals or transients past the sub-circuit to be decoupled, right to the return path. For a power supply line, a bypass capacitor from the supply voltage line to the power supply return (neutral) would be used. High frequencies and transient currents flow through a capacitor but DC current cannot go through the capacitor so the DC current continues on to the decoupled circuit.

In a switching sub-circuit suppressing switching noise is desirable. When a load is applied to a voltage source, it draws a certain amount of current. Typical power supply lines show inherent inductance resulting in a slower response to a change in current. This, in turn, affects transient voltage levels. If the load current is zero the voltage across the load is zero as well. This sudden voltage drop may be seen by other loads as well if the inductance between two loads is much lower compared to the inductance between the loads and the output capacitors of the power supply. This is only temporary but even a temporary reduction in voltage can disturb adjacent sub-circuits. Decoupling capacitors provide an instantaneous current jolt helping to maintain constant voltage across a sub-circuit or provide a low impedance path for the transient currents.

To decouple other sub-circuits from a sudden current demand, a decoupling capacitor can be placed between the supply voltage line and its reference (ground) next to the switched load. While the load is switched out, the capacitor charges up to full power supply voltage and otherwise does nothing. When the load is applied, the capacitor initially supplies demanded current. Ideally, by the time the capacitor runs out of charge, the power supply line inductance is saturated, and the load can draw full current at normal voltage from the power supply and the capacitor can recharge too.

Transient load decoupling as described above may be needed when there is a large load that gets switched quickly. The parasitic inductance in every decoupling capacitor may limit the suitable capacity if switching occurs very fast. Logic circuits tend to do sudden switching so logic circuit boards often have a decoupling capacitor close to each logic IC connected from each power supply connection to a nearby ground. These capacitors may decouple every IC from every other IC in terms of supply voltage dips. These capacitors are often placed at each power source as well as at each analog component in order to ensure that the power supplies are as steady as possible.

A transient load decoupling capacitor should usually be placed as close as possible to the device requiring the decoupled signal. The goal is to minimize the amount of line inductance and series resistance between the decoupling capacitor and that device, and the longer the conductor between the capacitor and the device, the more inductance there is.

The guidelines for placing a high-speed decoupling capacitor on a multi-layer printed circuit board depend on whether the board has dedicated power distribution planes and how closely spaced those planes are. Since capacitors differ in their high-frequency characteristics (and capacitors with good high-frequency properties are often types with small capacity, while large capacitors usually have worse high-frequency response), decoupling often involves the use of a combination of capacitors. The embodiments are not limited in this context.

SoC(s) and MCM(s) are extremely densely packed and therefore make it difficult to place a decoupling capacitor close to an input port.

Reference is now made to the drawings, wherein like reference numerals are used to refer to like elements throughout. In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives falling within the spirit and scope of the claimed subject matter.

FIG. 1 illustrates a block diagram of a system according to an embodiment. The system may be representative of a computer platform 100. The computer platform 100 may include a packaging component 110 such as, for instance, a printed circuit board (PCB). The packaging component 110 may encompass multiple components that are mounted thereon. In this example, the packaging component 110 may have mounted thereon a system on a chip component 120. While not shown, the packaging component 110 may have mounted thereon multiple chip components 120. The chip component 120 may take the form of, for instance, a System on a Chip (SoC) or a Multi-Chip Module (MCM).

The chip component 120 may include an input port 140, or multiple input ports (not shown). The input port 120 may comprise a power supply input port, a reference voltage input port, a high speed switching port, etc. The input port 140 may be coupled with additional chip component circuitry 130. The input port may receive a signal (e.g., a current) that is intended to operate or drive the chip component circuitry 130 in a particular manner.

The packaging component 110 may further include a decoupling component 150 mounted thereon. The decoupling component 150 may take the form of a capacitor. The decoupling component 150 may be electrically connected to the input port 140 via two conductive traces 160, 170. Decoupling refers to shielding one part of an electrical network (circuit) from another. A decoupling capacitor may be used to shunt noise caused by other circuit elements through the capacitor, reducing the effect they have on the chip component circuitry 130. Conductive trace 160 may carry current into the input port forming an input current path while conductive trace 170 may carry current from the input port to the decoupling component forming a return current path.

Figure 2:
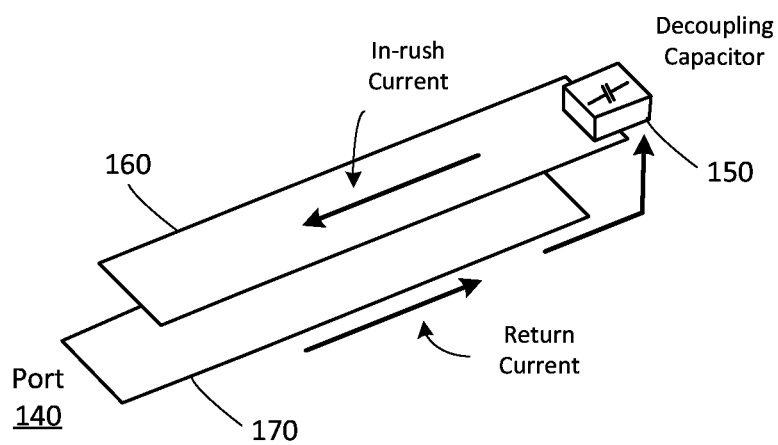
FIG. 2 illustrates a decoupling arrangement according to an embodiment.

FIG. 2 illustrates a decoupling arrangement 200 according to an embodiment. In typical decoupling arrangements, the decoupling component is physically located as close to the input port and a single conductive trace is made as wide as possible to help reduce parasitic inductance that may lead to voltage ringing or general port ineffectiveness. When the chip component 120 is a SoC or an MCM, space is limited and routing a wide trace may be unfeasible. In addition, mounting constraints associated with SoCs and MCMs prevent the decoupling component from being mounted as close to the port as is desired.

To compensate for a narrower conductive trace and an increased distance between the port 140 and the decoupling component 150, two stacked conductive traces 160, 170 may be implemented creating a three-dimensional decoupling arrangement. By stacking the conductive traces 160, 170 and separating the input current and the return path current, both the width limitation and the additional distance of the typical conductive trace implementation may be addressed. The conductive traces 160, 170 are positioned and oriented to as close to equal and opposite electromagnetic fluxes. Thus, the conductive traces 160, 170 are generally spaced apart in the vertical sense but substantially cover one another.

In operation when a signal (labeled as 'in-rush current') flows into input port 140 through the upper conductive trace 160, the return current path to the decoupling component 150 will be through the lower conductive trace 170. The current in the return current path conductive trace 170 will be substantially equal and opposite to the current in the input current path conductive trace 160. Since the current flows are in opposite directions, their respective electromagnetic fluxes will be opposite as well. The opposing electromagnetic fluxes tend to cancel one another thereby reducing the series inductance existing in both the upper and lower conductive traces 160, 170.

Figure 3:
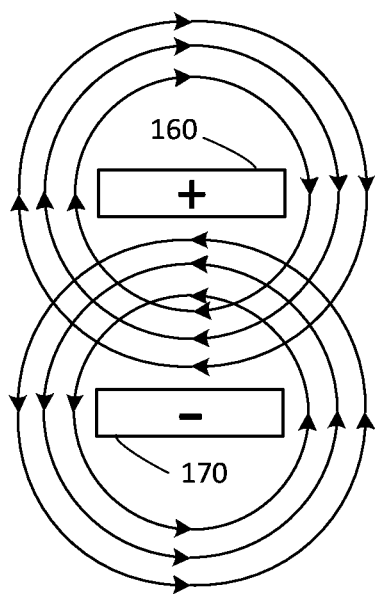
FIG. 3 illustrates an electromagnetic flux for the embodiment in FIG. 2.

FIG. 3 illustrates electromagnetic flux field lines 300 for the embodiment in FIG. 2. The electromagnetic fluxes for each conductive trace 160, 170 appear equal and opposite. The conductive traces 160, 170 are shown from the perspective of an end view or axially in FIG. 3. The "+" in conductive trace 160 is indicative of current flowing into the input port 120 while the "−" in conductive trace 170 is indicative of current flowing into the decoupling component 150. The electromagnetic flux field lines 300 are opposite since the current flow is in the opposite direction. The electromagnetic flux field lines 300 tend to cancel which reduces the series inductance that may be present in both conductive traces 160, 170.

Figure 4:
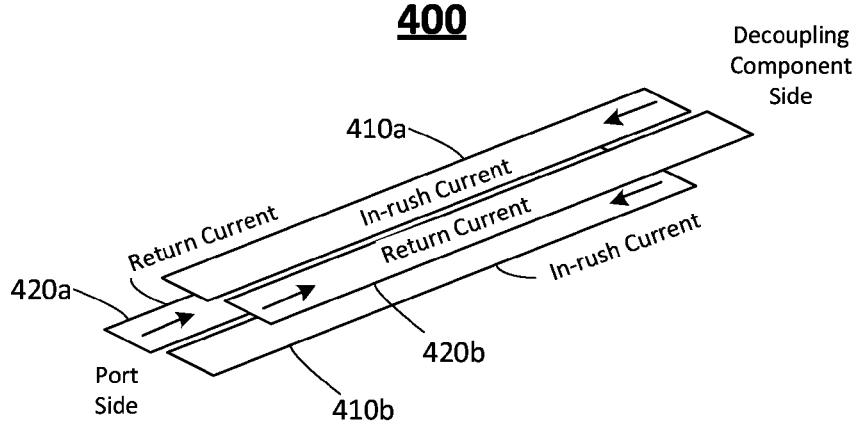
FIG. 4 illustrates a decoupling arrangement according to another embodiment.

FIG. 4 illustrates a decoupling arrangement 400 according to another embodiment. In this embodiment, the parasitic inductance may be reduced even further by varying the geometry of the decoupling arrangement. For instance, the input current conductive trace may be split into two non-overlapping input current conductive traces 410a, 410b in which input current conductive trace 410a is placed in the upper layer while input current conductive trace 410b is placed in the lower layer. Similarly, the return current conductive trace may be split into two non-overlapping return current conductive traces 420a, 420b in which input current conductive trace 420a is placed in the lower layer while return current conductive trace 420b is placed in the upper layer. The conductive traces 410a and 420a may be arranged such that input current conductive trace 410a is positioned substantially atop return current conductive trace 420a. Similarly, conductive traces 410b and 420b may be arranged such that return current conductive trace 420b is positioned substantially atop input current conductive trace 410b. In addition, conductive trace 410b may be horizontally spaced apart from, but in the same plane as, conductive trace 420a. Similarly, conductive trace 420b may be horizontally spaced apart from, but in the same plane as, conductive trace 410a.

The input current conductive traces 410a, 410b are interleaved with the return current conductive traces 420a, 420b. The input current conductive traces 410a, 410b do not overlap one another just as the return current conductive traces 420a, 420b do not overlap one another. This interleaved arrangement enhances the inductive cancellation benefits among the conductive traces 410a, 410b, 420a, and 420b.

Figure 5:
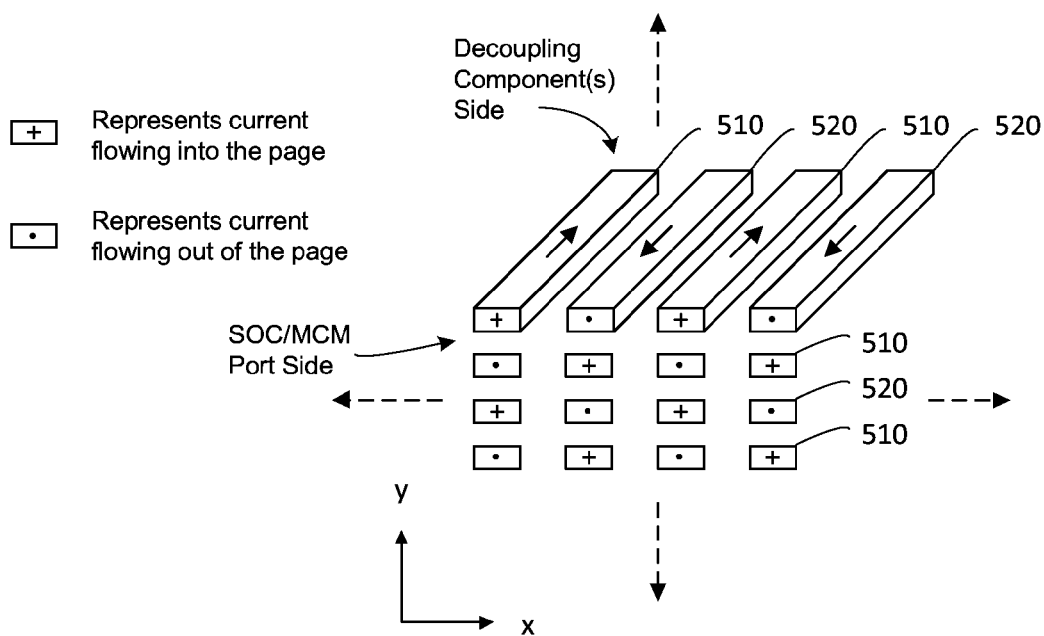
FIG. 5 illustrates a decoupling arrangement according to another embodiment.

FIG. 5 illustrates a decoupling arrangement 500 according to another embodiment. In this embodiment, the decoupling arrangement 500 forms a matrix of interleaved input current conductive traces 510 and return current conductive traces 520. Each of the interleaved input current conductive traces 510 and return current conductive traces 520 electrically connect the input port 140 to the decoupling component 150. The matrix of interleaved input current conductive traces 510 and return current conductive traces 520 may be arranged in rows and columns such that each row defines a separate plane wherein adjacent columns within each row alternate between an input current conductive trace 510 and a return current conductive trace 520. In addition, the first column in each row alternates between an input current conductive trace 510 and a return current conductive trace 520.

The decoupling arrangement 500 extends the interleaved structure in both the number of layers (e.g., rows) and pairs of side by side wires (e.g., columns) used. The number of input current conductive trace 510 and return current conductive trace 520 pairs illustrated in FIG. 5 create a 4×4 matrix. The size of the matrix is exemplary, however, and not limiting as the matrix of interleaved conductive traces 510, 520 may vary depending on the space available. Each pair of input current and return current conductive traces 510, 520 in either the x or y direction creates an electromagnetic flux that may be opposite to the electromagnetic flux created by the adjacent pair of input current and return current conductive traces 510, 520 and therefore partially cancels. This partial cancellation enhances the decoupling performance in the restricted space available in SoC or MCM chip components.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Figure 6:
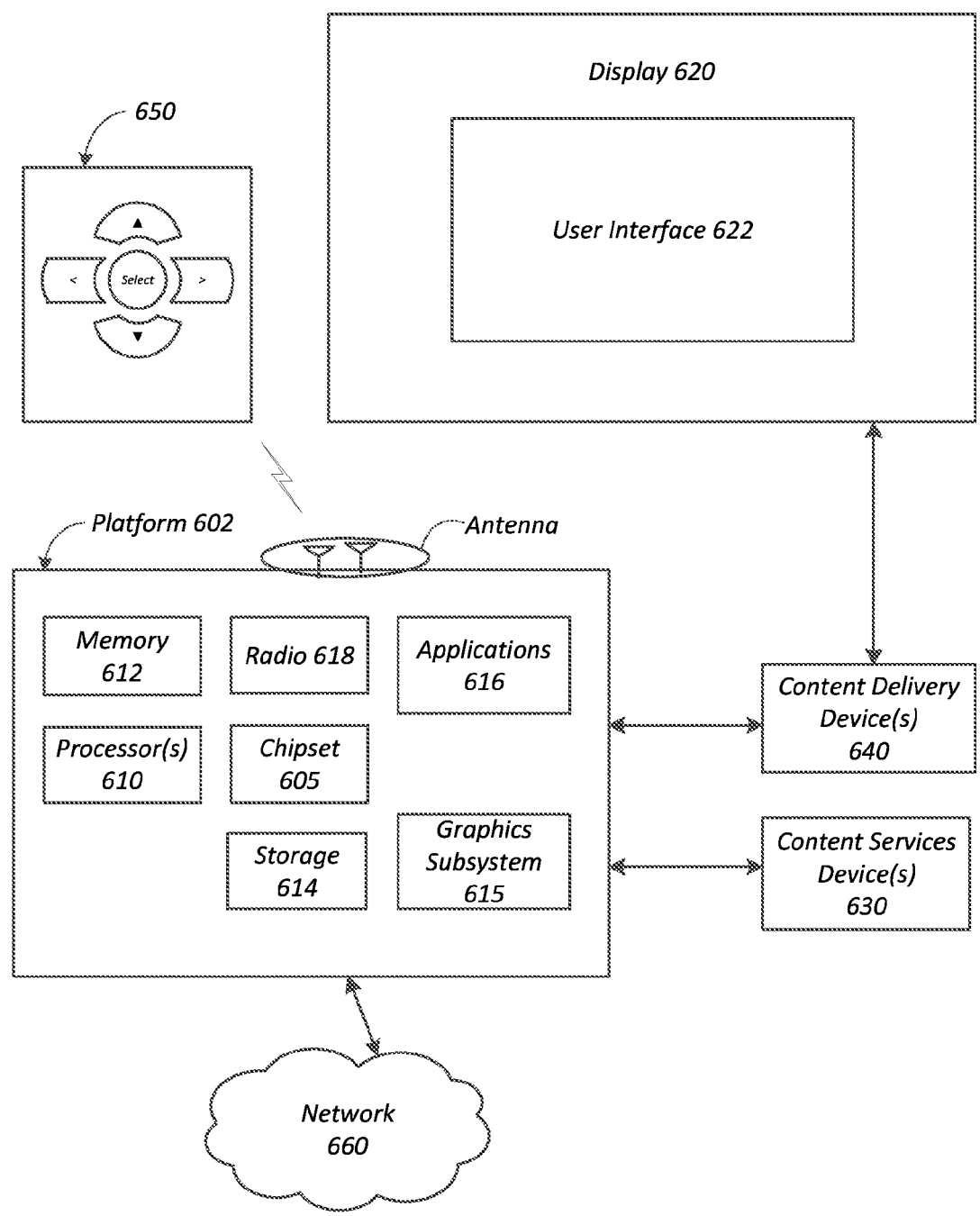
FIG. 6 illustrates an embodiment of a system that may be suitable for implementing embodiments of the disclosure.

FIG. 6 illustrates an embodiment of a system 600 that may be suitable for implementing decoupling arrangement embodiments of the disclosure. In embodiments, system 600 may be a system capable of implementing the decoupling arrangement embodiments described above although system 600 is not limited to this context. For example, system 600 may be incorporated into a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

In embodiments, system 600 comprises a platform 602 coupled to a display 620. Platform 602 may receive content from a content device such as content services device(s) 630 or content delivery device(s) 640 or other similar content sources. A navigation controller 650 comprising one or more navigation features may be used to interact with, for example, platform 602 and/or display 620. Each of these components is described in more detail below.

In embodiments, platform 602 may comprise any combination of a chipset 605, processor(s) 610, memory 612, storage 614, graphics subsystem 615, applications 616 and/or radio 618. Chipset 605 may provide intercommunication among processor 610, memory 612, storage 614, graphics subsystem 615, applications 616 and/or radio 618. For example, chipset 605 may include a storage adapter (not depicted) capable of providing intercommunication with storage 614.

Processor(s) 610 may be implemented as Complex Instruction Set Computer (CISC) or Reduced Instruction Set Computer (RISC) processors, x86 instruction set compatible processors, multi-core, or any other microprocessor or central processing unit (CPU). In embodiments, processor(s) 610 may comprise dual-core processor(s), dual-core mobile processor(s), and so forth.

Memory 612 may be implemented as a volatile memory device such as, but not limited to, a Random Access Memory (RAM), Dynamic Random Access Memory (DRAM), or Static RAM (SRAM).

Storage 614 may be implemented as a non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In embodiments, storage 614 may comprise technology to increase the storage performance enhanced protection for valuable digital media when multiple hard drives are included, for example.

Graphics subsystem 615 may perform processing of images such as still or video for display. Graphics subsystem 615 may be a graphics processing unit (GPU) or a visual processing unit (VPU), for example. An analog or digital interface may be used to communicatively couple graphics subsystem 615 and display 620. For example, the interface may be any of a High-Definition Multimedia Interface, DisplayPort, wireless HDMI, and/or wireless HD compliant techniques. Graphics subsystem 615 could be integrated into processor 610 or chipset 605. Graphics subsystem 615 could be a stand-alone card communicatively coupled to chipset 605.

The graphics and/or video processing techniques described herein may be implemented in various hardware architectures. For example, graphics and/or video functionality may be integrated within a chipset. Alternatively, a discrete graphics and/or video processor may be used. As still another embodiment, the graphics and/or video functions may be implemented by a general purpose processor, including a multi-core processor. In a further embodiment, the functions may be implemented in a consumer electronics device.

Radio 618 may include one or more radios capable of transmitting and receiving signals using various suitable wireless communications techniques. Such techniques may involve communications across one or more wireless networks. Exemplary wireless networks include (but are not limited to) wireless local area networks (WLANs), wireless personal area networks (WPANs), wireless metropolitan area network (WMANs), cellular networks, and satellite networks. In communicating across such networks, radio 618 may operate in accordance with one or more applicable standards in any version.

In embodiments, display 620 may comprise any television type monitor or display. Display 620 may comprise, for example, a computer display screen, touch screen display, video monitor, television-like device, and/or a television. Display 620 may be digital and/or analog. In embodiments, display 620 may be a holographic display. Also, display 620 may be a transparent surface that may receive a visual projection. Such projections may convey various forms of information, images, and/or objects. For example, such projections may be a visual overlay for a mobile augmented reality (MAR) application. Under the control of one or more software applications 616, platform 602 may display user interface 622 on display 620.

In embodiments, content services device(s) 630 may be hosted by any national, international and/or independent service and thus accessible to platform 602 via the Internet, for example. Content services device(s) 630 may be coupled to platform 602 and/or to display 620. Platform 602 and/or content services device(s) 630 may be coupled to a network 660 to communicate (e.g., send and/or receive) media information to and from network 660. Content delivery device(s) 640 also may be coupled to platform 602 and/or to display 620.

In embodiments, content services device(s) 630 may comprise a cable television box, personal computer, network, telephone, Internet enabled devices or appliance capable of delivering digital information and/or content, and any other similar device capable of unidirectionally or bidirectionally communicating content between content providers and platform 602 and/display 620, via network 660 or directly. It will be appreciated that the content may be communicated unidirectionally and/or bidirectionally to and from any one of the components in system 600 and a content provider via network 660. Examples of content may include any media information including, for example, video, music, medical and gaming information, and so forth.

Content services device(s) 630 receives content such as cable television programming including media information, digital information, and/or other content. Examples of content providers may include any cable or satellite television or radio or Internet content providers. The provided examples are not meant to limit embodiments of the invention.

In embodiments, platform 602 may receive control signals from navigation controller 650 having one or more navigation features. The navigation features of controller 650 may be used to interact with user interface 622, for example. In embodiments, navigation controller 650 may be a pointing device that may be a computer hardware component (specifically human interface device) that allows a user to input spatial (e.g., continuous and multi-dimensional) data into a computer. Many systems such as graphical user interfaces (GUI), and televisions and monitors allow the user to control and provide data to the computer or television using physical gestures.

Movements of the navigation features of controller 650 may be echoed on a display (e.g., display 620) by movements of a pointer, cursor, focus ring, or other visual indicators displayed on the display. For example, under the control of software applications 616, the navigation features located on navigation controller 650 may be mapped to virtual navigation features displayed on user interface 622, for example. In embodiments, controller 650 may not be a separate component but integrated into platform 602 and/or display 620. Embodiments, however, are not limited to the elements or in the context shown or described herein.

In embodiments, drivers (not shown) may comprise technology to enable users to instantly turn on and off platform 602 like a television with the touch of a button after initial boot-up, when enabled, for example. Program logic may allow platform 602 to stream content to media adaptors or other content services device(s) 630 or content delivery device(s) 640 when the platform is turned "off." In addition, chip set 605 may comprise hardware and/or software support for 5.1 surround sound audio and/or high definition 6.1 surround sound audio, for example. Drivers may include a graphics driver for integrated graphics platforms. In embodiments, the graphics driver may comprise a peripheral component interconnect (PCI) Express graphics card.

In various embodiments, any one or more of the components shown in system 600 may be integrated. For example, platform 602 and content services device(s) 630 may be integrated, or platform 602 and content delivery device(s) 640 may be integrated, or platform 602, content services device(s) 630, and content delivery device(s) 640 may be integrated, for example. In various embodiments, platform 602 and display 620 may be an integrated unit. Display 620 and content service device(s) 630 may be integrated, or display 620 and content delivery device(s) 640 may be integrated, for example. These examples are not meant to limit the invention.

In various embodiments, system 600 may be implemented as a wireless system, a wired system, or a combination of both. When implemented as a wireless system, system 600 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 600 may include components and interfaces suitable for communicating over wired communications media, such as input/output (I/O) adapters, physical connectors to connect the I/O adapter with a corresponding wired communications medium, a network interface card (NIC), disc controller, video controller, audio controller, and so forth. Examples of wired communications media may include a wire, cable, metal leads, printed circuit board (PCB), backplane, switch fabric, semiconductor material, twisted-pair wire, co-axial cable, fiber optics, and so forth.

Platform 602 may establish one or more logical or physical channels to communicate information. The information may include media information and control information. Media information may refer to any data representing content meant for a user. Examples of content may include, for example, data from a voice conversation, videoconference, streaming video, electronic mail ("email") message, voice mail message, alphanumeric symbols, graphics, image, video, text and so forth. Data from a voice conversation may be, for example, speech information, silence periods, background noise, comfort noise, tones and so forth. Control information may refer to any data representing commands, instructions or control words meant for an automated system. For example, control information may be used to route media information through a system, or instruct a node to process the media information in a predetermined manner. The embodiments, however, are not limited to the elements or in the context shown or described in FIG. 6.

As described above, system 600 may be embodied in varying physical styles or form factors. FIG. 7 illustrates embodiments of a small form factor device 700 in which system 600 may be embodied. In embodiments, for example, device 700 may be implemented as a mobile computing device having wireless capabilities. A mobile computing device may refer to any device having a processing system and a mobile power source or supply, such as one or more batteries, for example.

As described above, examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

Examples of a mobile computing device also may include computers that are arranged to be worn by a person, such as a wrist computer, finger computer, ring computer, eyeglass computer, belt-clip computer, arm-band computer, shoe computers, clothing computers, and other wearable computers. In embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

As shown in FIG. 7, device 700 may comprise a housing 702, a display 704, an input/output (I/O) device 706, and an antenna 708. Device 700 also may comprise navigation features 712. Display 704 may comprise any suitable display unit for displaying information appropriate for a mobile computing device. I/O device 706 may comprise any suitable I/O device for entering information into a mobile computing device. Examples for I/O device 706 may include an alphanumeric keyboard, a numeric keypad, a touch pad, input keys, buttons, switches, rocker switches, microphones, speakers, voice recognition device and software, and so forth. Information also may be entered into device 700 by way of microphone. Such information may be digitized by a voice recognition device. The embodiments are not limited in this context.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Embodiments may also be at least partly implemented as instructions contained in or on a non-transitory computer-readable medium, which may be read and executed by one or more processors to enable performance of the operations described herein.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Further, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

What is claimed is:

1. An apparatus, comprising:
    a decoupling arrangement to reduce an inductance between a port and a decoupling component, the decoupling arrangement comprising:
        a first current path to electrically couple the port to the decoupling component, the first current path comprising a conductive trace in a first layer of a multi-layer substrate; and
        a second current path to electrically couple the port to the decoupling component, the second current path comprising a conductive trace in a second layer of the multi-layer substrate, the first and second current paths comprising vertically spaced current paths that substantially cover one another.

2. The apparatus of claim 1, the port to comprise a power supply port.

3. The apparatus of claim 1, the decoupling component to comprise a capacitor.

4. The apparatus of claim 1, the decoupling component to comprise a plurality of capacitors.

5. The apparatus of claim 1, the decoupling arrangement to reduce an inductance between a second port and the decoupling component.

6. The apparatus of claim 1, the port to comprise a port of a chip component.

7. The apparatus of claim 6, the chip component to comprise a field programmable gate array (FPGA).

8. The apparatus of claim 6, the chip component comprised on a printed circuit board (PCB).

9. The apparatus of claim 8, the decoupling component comprised on the PCB.

* * * * *